United States Patent

Aviram

[11] Patent Number: 5,972,571
[45] Date of Patent: Oct. 26, 1999

[54] NEGATIVE RESIST COMPOSITION AND USE THEREOF

[75] Inventor: Ari Aviram, Croton-on-Hudson, N.Y.

[73] Assignee: International Business Machines Corporation, Armonk, N.Y.

[21] Appl. No.: 08/982,790

[22] Filed: Dec. 2, 1997

[51] Int. Cl.$^6$ ..................................... G03C 5/00
[52] U.S. Cl. .................. 430/325; 430/270.1; 430/921
[58] Field of Search .................. 430/921, 325, 430/270.1

[56] References Cited

U.S. PATENT DOCUMENTS

| | | | |
|---|---|---|---|
| 4,262,082 | 4/1981 | Rosenkranz | 430/296 |
| 4,904,568 | 2/1990 | Kondo et al. | 430/294 |
| 5,068,258 | 11/1991 | Noguchi | 522/31 |
| 5,204,225 | 4/1993 | Feely | 430/325 |
| 5,506,088 | 4/1996 | Nozaki et al. | 430/270.1 |
| 5,693,452 | 12/1997 | Aoai et al. | 430/270.1 |

FOREIGN PATENT DOCUMENTS

| | | | |
|---|---|---|---|
| 0 674 224 A1 | 9/1995 | European Pat. Off. | G03F 7/023 |
| 0 702 271 A1 | 3/1996 | European Pat. Off. | C03F 7/039 |

OTHER PUBLICATIONS

Lamola, A.A, "Chemically Amplified Resists", Solid State Tech., Aug. 1991, pp. 53–60.
Aldrich chemical catalog, 1990–1991, p. 344.

*Primary Examiner*—Janet Baxter
*Assistant Examiner*—Rosemary Ashton
*Attorney, Agent, or Firm*—Pollock, Vande Sande & Amernick; Daniel P. Morris

[57] ABSTRACT

Negative lithographic patterns are produced by imagewise exposing to electromagnetic radiation compositions comprising a polymer having pendant recurring ester groups or carbonate groups or both that contain a hetero atom; and a photoinitiator capable of releasing acid upon exposure to electromagnetic radiation. Specific polymersave poly (Hydroxy Alkyl) maleates.

18 Claims, No Drawings

NEGATIVE RESIST COMPOSITION AND USE THEREOF

TECHNICAL FIELD

The present invention relates to lithographic materials useful in device fabrication, where negative patterns are desired or required. The lithographic materials of the present invention undergo radiation induced reactions upon exposure to electromagnetic radiation such as UV radiation below 248 nm, x-rays and e-beams. Upon exposure to electromagnetic radiation, the resist materials of the present invention undergo a chemical change that renders them insoluble in aqueous bases, while the unexposed regions are soluble in the basic developer. The reaction is very efficient and leads to high resolution patterns with high sensitivity.

The reaction involves polymer crosslinking leading to dense networks, a desirable feature for the produced patterns. Furthermore, the reaction is enhanced due to the acid catalysts, leading to very fast reacting resist formulations.

BACKGROUND OF THE INVENTION

The lithographic process comprises several steps which include coating a thin film of the radiation sensitive resist onto a substrate which is selectively image-wise exposed to radiation that defines a pattern on the coating. In so doing, a solubility difference is induced between the exposed and unexposed areas and the developer used in the pattern development process is capable of distinguishing between the two regions and preferentially removing one kind or the other. When the exposed areas are removed by the developer, the remaining pattern is positive while the opposite leads to negative patterns.

The manufacture of integrated circuits and other patterned devices relies primarily on resist materials that enable the formation of high resolution patterns. In the search for materials and methods for formation of patterns below 0.25 microns, it is recognized that such patterns require exposure sources based on UV radiation below 248 nm, or x-ray, or e-beam. In the case of the UV radiation, it might be convenient to use excimer laser sources that produce radiation at 193 nm. Likewise, it is essential to employ resist materials suitable for use with short wavelengths sources.

Moreover, in microcircuits, the critical levels are typically manufactured with negative resists. These levels are found primarily in the gate regions of the transistors, where precise critical dimensions are needed. Since the speed performance of the transistor is directly related to the gate size, it is important to maintain uniform dimensions throughout the circuit, otherwise the timing of the interactions between the components is thrown off and the device malfunctions.

It seems that the need for negative resists at these manufacturing levels is needed because of the difference in performance of positive resists and negative resists with isolated and nested lines. From experience with resists and processes used in CMOS, it is known that some positive resists overemphasize nested lines, while negative resists overemphasize (by much less) isolated lines. The real problem comes from the follow-up step which is a reactive ion etching. In this step there is over etching in isolated lines. Thus, if positive resist is used, then the error is compounded, and conversely when negative resist is used, the error is cancelled. This leads to small ACLV (Across Chip Linewidth Variation).

In the case of memory chips, the circuitry is very repetitive and redundant. There, one can compensate the mask to account for the problems mentioned above and thus use positive resists. However, in logic circuits the patterns are very diverse and such compensation on the mask is impractical. Therefore the critical levels in logic circuits depend upon negative resists.

Another level that is preferentially manufactured with negative resists is the first level of metallization. This level is performed by etching a film of metal. The use of negative resists at this level is due to thin film effects and especially reflective notching from underlying layers which is reduced by negative resists. These resists also have their better thermal stability which is needed during etching processes, and better performance when contamination and mask defects are considered.

A third level where use of negative resists is customary but not critical involves making of alignment marks.

In the manufacture of CMOS, there are additional levels that are manufactured with negative resists. These are "Block Levels" which are not regarded as "critical". The use of negative resists in these levels is motivated by the empirical observation that these resists contain less metal ions than positive resists and for those levels this is an important consideration.

The market for negative resists is smaller than the positive resists by a considerable margin (5:1 or so). But their importance to the manufacturing process cannot be overestimated, particularly in view of shrinking dimensions in future device generations. Negative resists have been widely discussed recently. Commercial formulations that incorporate base soluble polymers, acid sensitive crosslinking agents and photoacid generators have been introduced to the marketplace. However, it would be desirable to provide a negative resist capable of operating at 193 nm UV radiation.

SUMMARY OF INVENTION

The present invention provides a negative acting photosensitive resist composition capable of high resolution using electromagnetic radiation including UV radiation at 193 nanometers. In fact, the present invention is suitable for manufacturing electronic components having pattern resolution on the order of about 0.175 microns.

The negative resist compositions of the present invention comprise a polymer having recurring pendant ester and/or carbonate groups that contain a hetero atom; and a photoinitiator capable of releasing acid upon exposure to electromagnetic radiation.

The present invention is also concerned with producing a negative lithographic pattern on a substrate that comprises providing on the substrate a coating of the above disclosed composition. The coating is then imagewise exposed to actinic light, x-ray or e-beam. The lithographic pattern is developed by contacting the exposed coating with a developer to thereby remove the portions of the polymer not exposed to the actinic light, x-ray or e-beam.

Other objects and advantages of the present invention will become readily apparent to those skilled in this art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

DESCRIPTION OF BEST AND VARIOUS MODES FOR CARRYING OUT INVENTION

According to the present invention, a negative acting photosensitive resist composition is provided that contains a polymer having recurring pendant ester and/or carbonate groups that contain a hetero atom. Suitable hetero atoms are oxygen and sulphur.

The polymers preferably contain an oxygen or sulfur containing group, located in the beta position of an ester or carbonate group. Suitable oxygen and sulfur containing groups are hydroxy groups, thiols, ethers, thioethers, and esters. The polymers can be homopolymers, copolymers or mixtures of polymers. The polymers employed according to the present invention preferably contain pendant recurring groups selected from the group consisting of:

—COO—$CH_2$—CH(HE)—$(CH_2)_x$—H wherein x is an integer of 0–20;

—COO—$CH_2$CH(HE)—$(CH_2)_y$—HE—$(CH_2)_z$—H wherein HE is O or S; and each y and z individually is 1–18; and mixtures thereof.

Especially preferred polymers employed pursuant to the present invention are poly(2-hydroxyalkyl acrylate), poly(2-hydroxyalkyl methacrylate), poly(2-thiolalkyl acrylate) and poly(2-thiolalkyl methacrylate). Other suitable polymers include poly(2-hydroxyalkyl maleate) and poly(2-thiolalkyl maleate).

The alkyl group are straight or branched chain saturated hydrocarbon having from 1 to 22 carbon atoms.

Some examples of suitable polymers are:

Poly(2-hydroxyethyl methacrylate)
Poly(2-hydroxypropyl methacrylate)
Poly(2-hydroxybutyl methacrylate)
Poly(2-hydroxypentyl methacrylate)
Poly(2-hydroxyethyl acrylate)
Poly(2-hydroxypropyl acrylate)
Poly(2-hydroxybutyl acrylate)
Poly(2-hydroxypentyl acrylate)
Poly(2-thiolethyl methacrylate)
Poly(2-thiolpropyl methacrylate)
Poly(2-thiolbutyl methacrylate)
Poly(2-thiolpentyl methacrylate)
Poly(2-thiolethyl acrylate)
Poly(2-thiolpropyl acrylate)
Poly(2-thiolbutyl acrylate)
Poly(2-thiolpentyl acrylate)
Poly(2-hydroxyethyl maleate)
Poly(2-hydroxypropyl maleate)
Poly(2-hydroxybutyl maleate)
Poly(2-hydroxypentyl maleate)
Poly(2-thiolethyl maleate)
Poly(2-thiolpropyl maleate)
Poly(2-thiolbutyl maleate)
Poly(2-thiolpentyl maleate)

Other suitable homopolymers include those having as backbone a polyacrylate, a polymethacrylate, a polymaleate, a polyvinyl alcohol, polystyrene and polyhydroxystyrene.

Preferred copolymers employed pursuant to the present invention are copolymers 1) of the above-defined 2-hydroxy and/or 2-thiol monomers along with 2) a monomer having the following formula:

$CH_2CHCOO$ $(CH_2)_n$H and/or $CH_2C(CH_3)$ $COO(CH_2)_n$H; wherein n=1 to 10. The amount of 1) is about 75 to about 95, preferably about 80 to about 90, and most preferably about 84 to about 87 wt. % and the amount of 2) is about 5 to about 25, preferably about 10 to about 20 and most preferably about 13 to about 16 wt. % These weight percents are based upon the total weight of 1) and 2).

The copolymers of the present invention are copolymers of 2-hydroxyalkyl methacrylate, 2-thiolakyl methacrylate, 2-thiolalkyl acrylate, and/or 2-hydroxyalkyl acrylate with alkylacrylate and/or alkylmethacrylate. As used in describing the resins which may be used in this invention, the term alkyl in the ester moiety refers to a straight or branched chain hydrocarbon having from 1 to 10 carbon atoms and containing no unsaturation. Specific copolymers suitable for purposes of the present invention are: copolymers of 2-hydroxyethyl methacrylate and methylmethacrylate; copolymers of 2-hydroxypropyl methacrylate and methylmethacrylate; copolymers of 2-hydroxyethyl methacrylate and t-butylmethacrylate; copolymers of 2-hydroxypropyl methacrylate and t-butylmethacrylate; copolymers of 2-hydroxyethyl acrylate and t-butylmethacrylate; copolymers of 2-hydroxypropyl acrylate and t-butylmethacrylate; copolymers of 2-hydroxyethyl methacrylate and methacrylate; copolymers of 2-hydroxypropyl methacrylate and methylacrylate; copolymers of 2-hydroxyethyl acrylate and methylmethacrylate; copolymers of 2-hydroxypropyl acrylate and methylmethacrylate; copolymers of 2-hydroxyethyl acrylate and methylacrylate; copolymers of 2-hydroxypropyl acrylate and methylacrylate; copolymers of 2-hydroxypropyl acrylate and methylacrylate; copolymers of 2-hydroxybutyl methacrylate and methylmethacrylate; copolymers of 2-hydroxypentyl methacrylate and methylmethacrylate; copolymers of 2-hydroxybutyl acrylate and methylmethacrylate; and copolymers of 2-hydroxypentyl acrylate and methylmethacrylate.

Other suitable preferred copolymers include (1) the above-defined 2-hydroxy and/or 2-thiol monomers along with (2) styrene and/or hydroxystyrene. The amount of (1) is about 75 to 95 weight percent, and preferably about 80 to about 90 weight percent and the amount of (2) is about 5 to about 25 weight percent and preferably about 10 to about 20 weight percent of styrene and/or hydroxystyrene.

The polymers of the present invention typically have weight average molecular weight of about $10^4$ to about $10^6$, more typically about 50,000 to about 600,000, an example being about 300,000. The polymers typically have Tg of at least 70° C. The polymers are prepared by polymerization of the selected monomer or relative amount of monomers in an organic diluent such as isopropanol or tetrahydrofuran under reflux in a nitrogen atmosphere for about 24 hours in the presence of about 0.4% by weight of a free radical catalyst such as azoisobutyricdinitrile. The relative amount of organic diluent typically being about 20 to about 100 parts by weight per 1 part by weight of the monomers.

The polymer in the case of isopropanol is then precipitated out of solution by adding about 1 part by weight of water per 1 part of the isopropanol and then dried. In the case of tetrahydrofuran, the polymer is obtained by evaporating off the tetrahydrofuran, followed by dissolving in an alcohol such as isopropanol and then precipitating the polymer by adding water. The amount of alcohol and water typically being about 20 to about 100 parts by weight per 1 part of the starting monomers.

The compositions of the present invention also contain a photoinitiator or photoactive compound. The photoactive compound must be capable of releasing acid upon being exposed to electromagnetic radiation. Examples of such photoinitiators are well known and include onium salts and especially Group VIA and Group VIIA salts such as the pyrylium, selenonium, sulfonium, and iodonium salts.

Various suitable photoinitiators are discussed in U.S. Pat. Nos. 4,161,478; 4,442,197; 4,139,655; 4,400,541; 4,197,174; 4,173,476; and 4,299,938; and European Patent Applications 44/0094914 and 84/0126712, disclosures of which are incorporated herein by reference.

Also see Watt, et al., "A Novel Photoinitiator of Cationic Polymerization: Preparation and Characterization of Bis[4-(diphenylsulfonio)phenyl]-sulfide-Bis-Hexafluorophosphase", *Journal of Polymer Science: Polymer Chemistry Edition*, Vol. 22, p. 1789 (1980), John Wiley & Sons, Inc.

Additional discussions concerning sulfonium and iodonium salts can be found, for instance, in Crivello, et al., "Complex Triarylsulfonium Salt Photoinitiators. II. The Preparation of Several New Complex Triarylsulfonium Salts and the Influence of Their Structure in Photoinitiated Cationic Polymerization", *Journal of Polymer Science: Polymer Chemistry Edition*, Vol. 18, pp. 2697–2714 (1980), John Wiley & Sons, Inc.; Pappas, et al., "Photoinitiation of Cationic Polymerization. III. Photosensitization of Diphenyliodonium and Triphenylsulfonium Salts", *Journal of Polymer Science: Polymer Chemistry Edition*, Vol. 22, pp. 77–84 (1984), John Wiley & Sons, Inc.; Crivello, et al., "Photoinitiated Cationic Polymerization with Triarylsulfonium Salts", *Journal of Polymer Science: Polymer Chemistry Edition*, Vol. 17, pp. 977–999 (1979), John Wiley & Sons, Inc.; Crivello, et al., "Complex Triarylsulfonium Salt Photoinitiators. I. The Identification, Characterization, and Syntheses of a New Class of Triarylsulfonium Salt Photoinitiators", *Journal of Polymer Science: Polymer Chemistry Edition*, Vol. 18, pp. 2677–2695 (1980), John Wiley & Sons, Inc.; and Crivello, "Cationic Polymerization-Iodonium and Sulfonium Salt Photoinitiators", *Advances in Polymer Science*, Series #62, pp. 1–48 (1984), Springer-Verlag.

The preferred photoacid generators or initiators are triflic acid generators and substituted and unsubstituted diaryl and triarylsulfonium and iodonium salts. [Is this true?]

Compounds that generate triflic acid include onium salts such as diphenyl-iodonium triflate, di-t-butyl phenyl) iodonium triflate and triphenylsulfonium triflate and non-ionic compounds such as phthalimide triflate.

Mixtures of diphenyl-iodonium triflate, di(t-butyl-phenyl) iodonium triflate, or phthalimide triflate can be used.

Aromatic iodonium salts which can be employed in accordance with this invention thus include those having the formulae:

wherein $Ar^1$ and $Ar^2$ are aromatic groups having 4 to 20 carbon atoms and are preferably selected from phenyl, naphthyl, thienyl, and furanyl groups; and $Q^-$ is any anion, but preferably is an anion selected from tetrafluoroborate, hexafluorophosphate, hexafluoroarsenate, hexafluoroantimonate, trifluoromethanesulfonate or trifluoroacetate.

Among the useful iodonium salts are particularly included:

diphenyliodonium hexafluoroarsenate
diphenyliodonium hexafluoroantimonate
diphenyliodonium hexafluorophosphate
diphenyliodonium trifluoroacetate
4-trifluoromethylphenylphenyliodonium tetrafluoroborate
ditolyliodonium hexafluorophosphate
di(4-methoxyphenyl)iodonium hexafluoroantimonate
diphenyliodonium trifluoromethane sulfonate
di(t-butylphenyl iodonium hexafluoroantimonate
di(t-butylphenyl iodonium trifluoromethane sulfonate
(4-methylphenyl)phenyliodonium tetrafluoroborate
di-(2,4-dimethylphenyl)iodonium hexafluoroantimonate
di-(4-t-butylphenyl)iodonium hexafluoroantimonate 2,2'-diphenyliodonium hexafluorophosphate.

The photoinitiator employed is present in an amount sufficient to initiate the photochemical reaction. Usually the amount of photoinitiator is about 0.1 to about 4 percent by weight and preferably about 0.4 to about 0.6 percent by weight based upon the weight of the polymer on a dry basis.

The photochemical reaction leads to insolubilization of the polymer, and proceeds readily when the alcohol and/or thiol is in the beta position of an activating moiety such as the carboxyl of an ester, an ether, a thioether, an amide, or a phenyl.

The reaction is quite unexpected, particularly since the mechanism is not even fully appreciated even at this time. Nevertheless, it is apparent that the mechanism is not of the free radical type since free radical scavengers do not retard it. In fact, crosslinking may not be involved since the polymer precipitate can be solubilized in highly polar solvents such as N-methyl pyrrolidinone.

Typical film thicknesses of the compositions are bout 0.3 to about 1 micron and more typically about 0.5 to about 1 micron (dry).

The composition can be dissolved in an organic solvent such as isopropanol, dimethyformamide, perfluoroisopropanol or 1-methyl-1-pyrrolidinone. The solution can then be coated on to the desired substrate, such as by spin casting. Preferred substrates are those used in fabricating integrated circuits.

The polymeric film is then imagewise exposed to electromagnetic radiation such as actinic light, x-ray or e-beam to contact selected portions of the film without exposing the other portions of the film. Preferably, the actinic light employed is preferably deep UV (i.e., wavelengths of 193 nm and below), x-rays and e-beam.

According to preferred aspects of the present invention, the film, after the irradiation, is subjected to a post-exposure bake typically at temperatures of about 50° C. to about 200° C. for about 30 seconds to about 5 minutes. Compositions of the present invention are suitable for the 193 nm lithography.

A composition of poly(2-hydroxyethyl methacrylate) and photoinitiator exposed with UV at 193 nm and developed with tetramethylammonium hydroxide shows high contrast of this resist. The high efficiency of the photochemical reaction makes possible the use of polymers required by this aspect of the present invention.

The polymeric resists employed according to the present invention, after exposure and post bake, is then developed to provide the desired pattern. The developer can be an aqueous base such as ammonium hydroxide, tetramethyl ammonium hydroxide or pyridine. Suitable ammonium hydroxide compositions contain up to about 27% by weight and preferably about 3 to about 5% by weight. A suitable tetramethylammonium hydroxide composition is a 0.26 N solution (AZ-300). An example of pyridine developer is a 5% aqueous solution. Also, aqueous solutions of certain organic materials can be used as the developer. Such developers employed are aqueous solutions of about 0.001% to about 1% by weight of a compound containing at least one amino group, preferably two or more amine groups, and at least two sulfonate groups selected from the group consisting of alkali metal sulfonate, ammonium sulfonate group and mixtures thereof. Contact with these developers removes the portions of the polymeric material exposed to the actinic light.

The developers are amphoteric materials and include both monomeric and polymeric materials.

Examples of specific developers are:

1. CONGO RED C.I. No. 22120

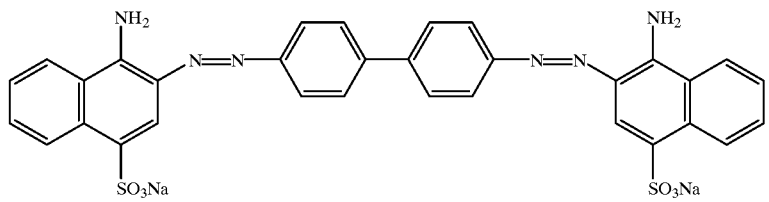

2. FLUORESCENT BRIGHTENER #28 C.I. No. 40622

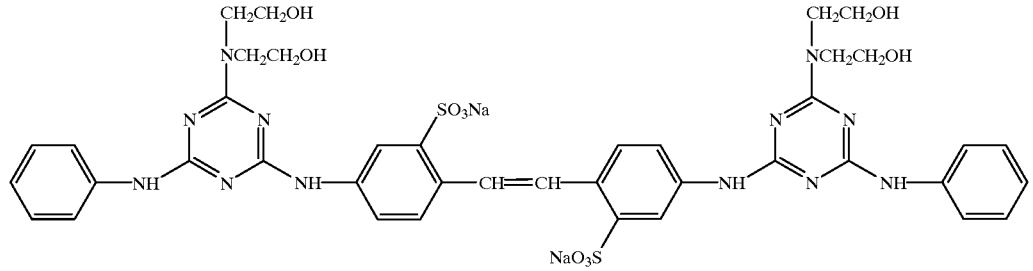

3. 1,4-Pipearazinediethanesulfonate disodium salt (Sodium pipesate)

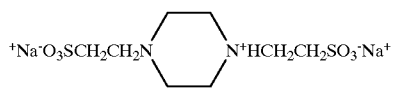

The developer can include additives such as added surfactants such as poly (sodium styrene sulfonate). When present, such is typically used in amounts of about 0.001 to about 0.5 wt. percent.

The following non-limiting examples are presented to further illustrate the present invention.

EXAMPLE 1

Poly(2-hydroxyethyl methacrylate) was dissolved in isopropanol to form a 10 wt. O solution. About 0.4 parts of the photoacid generator tri-phenyl sulfonium triflate per 100 parts of the polymer was added and a film was spin coated into a Si wafer. The post applied bake was 2 minutes at 100° C. The wafer was exposed through a mask with 15 mJ/sq.cm. radiation at 193 nanometer wavelength and the wafer was baked 2 minutes at 100° C. The resulting image was developed in congo red 0.1% aq. sol. A negative image was obtained. [What was the type of radiation used?]

EXAMPLE 2

Poly(2-hydroxypropyl methacrylate) was dissolved in isopropanol to form a 10 wt. % solution. About 0.4 of the photoacid generator tri-phenyl sulfonium triflate per 100 parts of the polymer was added and a film was spin coated into a Si wafer. The post applied bake was 2 minutes at 100° C. The wafer was exposed through a mask with 15 mJ/sq.cm. radiation at 193 nanometer wavelength and the wafer was baked 2 minutes at 100° C. The resulting image was developed in fluorescent brightener 28 0.1% aq. sol. A negative image was obtained.

In this disclosure, there are shown and described only the preferred embodiments of the invention, but as aforementioned, it is to be understood that the invention is capable of use in various other combinations and environments and is capable of changes or modifications within the scope of the inventive concept as expressed herein.

What is claimed is:

1. A negative acting photosensitive resist composition comprising:
   a polymer selected from the group consisting of poly(2-hydroxyethyl) maleate, poly(2-hydroxypropyl maleate), poly(2-hydroxybutyl maleate) and poly(2-hydroxypentyl maleate); and
   a photoinitiator capable of releasing acid upon exposure to electromagnetic radiation.

2. The negative acting photosensitive resist composition of claim 1 wherein said photoinitiator is an onium salt.

3. The negative acting photosensitive resist composition of claim 1 wherein said photoinitiator is an iodonium salt or a sulfonium salt.

4. The negative acting photosensitive resist composition of claim 1 wherein said photoinitiator generator is triflic acid.

5. The negative acting photosensitive resist composition of claim 1 wherein said photoinitiator is triphenylsulfonium triflate.

6. The negative acting photosensitive resist composition of claim 1 which further comprises an organic solvent.

7. The negative acting photosensitive resist composition of claim 16 wherein said organic solvent is isopropanol, dimethylformamide, perfluroisopropanol or 1-methyl-1-pyrrolidinone.

8. The negative acting photosensitive resist composition of claim 1 wherein the amount of said photoinitiator is about 0.1 to about 4 percent by weight based upon the weight of the polymer.

9. A process for providing a negative pattern on a substrate which comprises:

a) providing on said substrate a film of a composition comprising a polymer selected from the group consisting of poly(2-hydroxyethyl maleate, poly(2-hydroxypropyl maleate), poly(2-hydroxybutyl maleate) and poly(2-hydroxypentyl maleate; and a photoinitiator capable of releasing acid upon exposure to electromagnetic radiation;

(b) imagewise exposing said film to electromagnetic radiation; and (c) developing said lithographic pattern by contacting said film with a developer to thereby remove the portions of said film not exposed to said electromagnetic radiation.

10. The process of claim 9 wherein said electromagnetic radiation is actinic light, x-rays or e-beam.

11. Tie process of claim 9 wherein said electromagnetic radiation is deep UV irradiation with wavelengths below 240 nm.

12. The process of claim 9 wherein x-ray irradiation is employed.

13. The process of claim 9 wherein e-beam irradiation is employed.

14. The process of claim 9 where the developer comprises Congo Red.

15. The process of claim 9 where the developer comprises tetramethylammonium hydroxide.

16. The process of claim 9 which further comprises post baking said film after said exposure and before said developing.

17. The process of claim 9 wherein said developer is an aqueous solution of a material selected from the group consisting of ammonium hydroxide, tetramethyl ammonium hydroxide and pyridine.

18. The process of claim 9 wherein said electromagnetic radiation is UV radiation with wavelengths of 193 nm.

* * * * *